United States Patent [19]

Zinchuk

[11] 4,060,426
[45] Nov. 29, 1977

[54] TIN INDIUM OXIDE AND POLYVINYLCARBAZOLE LAYERED POLARIZED PHOTOVOLTAIC CELL

[75] Inventor: Michael Zinchuk, Waltham, Mass.

[73] Assignee: Polaroid Corporation, Cambridge, Mass.

[21] Appl. No.: 696,027

[22] Filed: June 14, 1976

Related U.S. Application Data

[63] Continuation-in-part of Ser. No. 485,129, July 2, 1974, abandoned.

[51] Int. Cl.$^2$ ............................................. H01L 31/06
[52] U.S. Cl. ........................... 136/89 NB; 204/192 P; 250/211 J; 250/212; 357/8; 357/30; 427/74; 427/84; 427/87; 354/23 R
[58] Field of Search .......... 136/89 NB, 89 CC, 89 SJ; 204/192 P; 250/211 R, 211 J, 212; 357/16, 30, 8

[56] References Cited

U.S. PATENT DOCUMENTS

| 2,932,590 | 4/1960 | Barrett et al. | 117/201 |
| 3,507,706 | 4/1970 | Webb | 136/89 |
| 3,722,998 | 3/1973 | Morse | 355/71 |
| 3,844,843 | 10/1974 | Kay et al. | 136/89 X |
| 3,847,659 | 11/1974 | Sobajima et al. | 117/211 |

OTHER PUBLICATIONS

Fraser et al., "Highly Conductive, Transparent Films of Sputtered $In_{2-x}SN_xO_{3-4}$", J. Electrochem. Soc., vol. 119, pp. 1368–1374 (1972).

Fraser, "Sputtered Films for Display Devices", Proc. IEEE, vol. 61, pp. 1013–1018 (1973).

Primary Examiner—John H. Mack
Assistant Examiner—Aaron Weisstuch
Attorney, Agent, or Firm—Edward S. Roman

[57] ABSTRACT

A polarized photosensitive transducer is provided with a substantially transparent substrate over which there is preferably deposed a substantially transparent electroconductive layer of tin oxide-indium oxide. Overlying the electroconductive layer, there is provided a substantially transparent photoconductive layer comprised of a polymerized vinylcarbazole compound. A second transparent electroconductive layer consisting of tin oxide-indium oxide is thereafter sputtered in overlying relation with respect to the photoconductive layer such that all the layers overlying the substrate cooperatively define a substantially transparent polarized photosensitive transducer.

4 Claims, 12 Drawing Figures

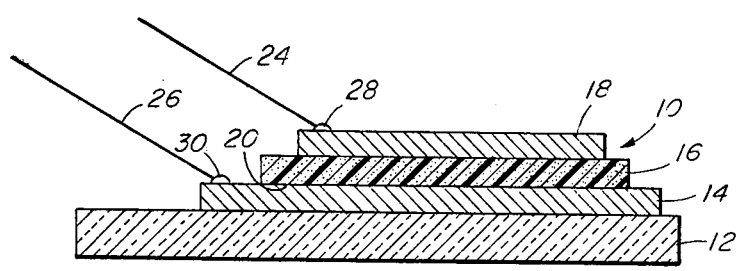
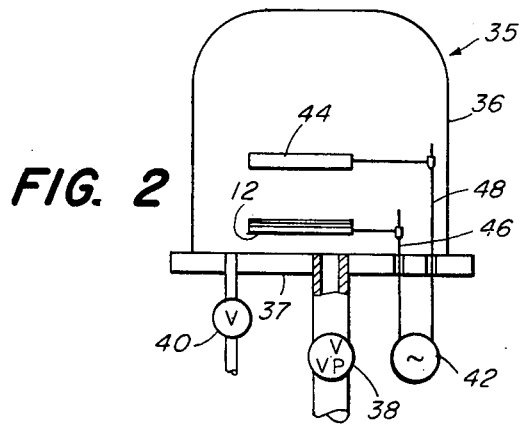
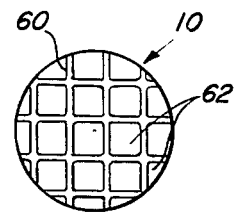
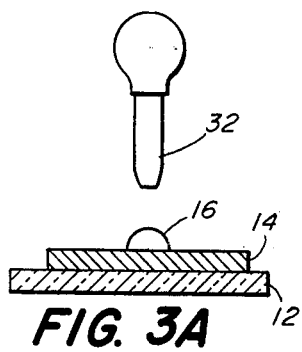
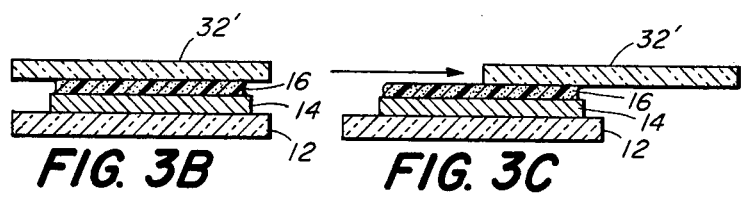
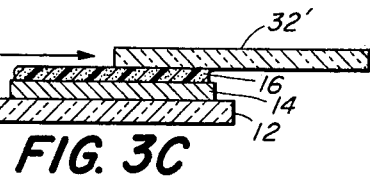
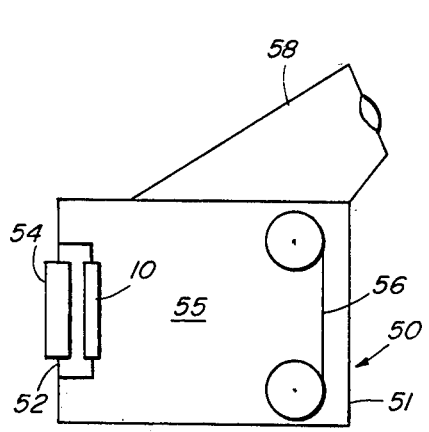
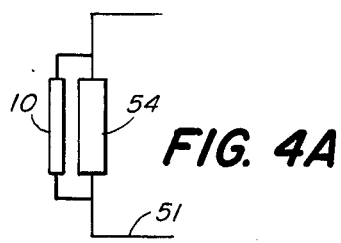
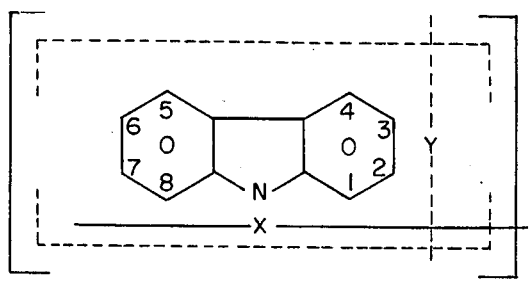

TIN INDIUM OXIDE AND POLYVINYLCARBAZOLE LAYERED POLARIZED PHOTOVOLTAIC CELL

CROSS REFERENCE TO OTHER APPLICATION

This application is a continuation-in-part of U.S. application Ser. No. 485,129 filed July 2, 1974, now abandoned.

BACKGROUND OF THE INVENTION

Field of the Invention

This invention relates generally to a photosensitive transducer and, more particularly, to an improved photosensitive transducer which is characterized by a high degree of light transmissivity therethrough, together with a highly desirable range of photoconductive and photovoltaic sensitivities.

2. Description of the Prior Art

Photosensitive tranducers are well known in the art and many exhibit photoconductive and/or photovoltaic properties. The term photoconductive generally means that the transducer is subject to a change in resistance impedance when subjected to radiation such as visible light. The term photovoltaic generally means that the transducer displays a varying output potential as a function of the radiation to which it is exposed.

Such photosensitive transducers have found general use in automatic exposure control systems for photographic apparatus. Exposure control systems basically function to evaluate scene brightness or illumination and weight this evaluation with respect to the sensitometric characteristics of the film being exposed so as to regulate one or more variable exposure control parameters, as for instance, exposure interval or aperture size in correspondence with the weight of the evaluation. Scene brightness evaluation may be performed by light measuring circuits utilizing one or more photosensitive transducers positioned upon a camera apparatus. The transducers are aligned in a manner to be responsive to the light characteristics of a scene approximately coincidence with that of the field of view of the camera lens system. Such photosensitive transducers may even be made substantially transparent and thus stationed in overlapping relation with respect to the camera lens system in order to evaluate a scene directly coincident with that of the field of view of the camera lens. The scene evaluated in this manner will have the exact light characteristics as the scene viewed by the camera lens.

Photosensitive transducers of a type suitable for use in the above-described exposure control system may also experience performance limitations. The output signal response of such photosensitive transducers is often insufficient to provide an adequate evaluation of the various levels of scene brightness which might normally be encountered, as for instance, between photographing indoors vs. outdoors. Such insufficiencies are due normally to the non-linear performance displayed by the transducer over the brightness region of interest for ordinary photographic purposes.

Photosensitive transducers of the above-described type having a high degree of radiation transmissivity there-through have also been proposed for use as solar cells on satellites or other similar objects due to their substantially equal response to solar radiation received from either of two opposite directions. In this manner, the number of solar cells may be reduced by one-half the number of solar cells otherwise required. Such cells have been described as substantially translucent and embody thin conductive films of such materials as copper oxide or tin oxide. Photosensitive transducers of this type, although sufficiently translucent to be equally responsive to radiation received from either of two opposite directions, are not polarized. Thus, the determination of positive and negative terminals when utilizing such a photosensitive transducer in the photovoltaic mode becomes dependent on the actual orientation of the cell with respect to the direction of light impingment.

Therefore, it is an object of this invention to provide a polarized, substantially transparent, photosensitive transducer having a highly desirable linear range of photovoltaic sensitivities.

It is a further object of this invention to provide a polarized, substantially transparent, photosensitive transducer which exhibits a highly desirable linear range of photoconductive sensitivities in approximately inverse relation with the log of intensity of illuminance to which the transducer is exposed.

It is an even further object of this invention to provide a polarized photosensitive transducer having a high degree of light transmissivity therethrough which transducer may be constructed in a simple and economical manner utilizing conventional sputtering apparatus.

SUMMARY OF THE INVENTION

The present invention is directed to a polarized photosensitive transducer or cell which may be connected to function as either a photoconductor cell or a photovoltaic cell. The photosensitive transducer of this invention includes a substrate made from either glass or plastic so as to have a high degree of radiation transmissivity therethrough. A first electrically conductive layer, preferably of tin oxide-indium oxide, is deposed on the substrate in order to provide a first electrode also having a high degree of radiation transmissivity therethrough. Overlying the electroconductive layer, there is provided a substantially transparent photoconductive layer comprised of a polymerized vinycarbazole compound. A second electroconductive layer also consisting of tin oxide-indium oxide is thereafter sputtered onto the photoconductive layer so as to provide a second electrode having a high degree of radiation transmissivity therethrough. In the preferred mode, the photoconductive layer comprises a mixture of poly-N-vinylcarbazole, 2,4,7-trinitro-9-flourenone, and tetrahydrafuran. It is also preferred that the tin oxide-indium oxide layers respectively comprise 90% tin oxide and 10% indium oxide.

The mode for applying the electroconductive layers involves the process of sputtering which takes place in an inert atmosphere of argon to which 5% oxygen has been added. The polymerized vinylcarbazole compound is preferrably applied by first placing a drop of the vinylcarbazole solution on top of the first conductive layer after which a second uncoated slide is placed on top of the drop to allow the solution to spread evenly between the first conductive layer and slide. The slide may then be slipped off in a direction substantially parallel to the plane of the substrate in order to leave a film of substantially uniform thickness on the first conductive layer.

The photosensitive transducer of this invention may be uniquely arranged in a photographic apparatus such that the image carrying light rays which pass through the camera taking lens will also pass directly through the photosensitive transducer before impinging on the film plane. In this manner, an automatic exposure control system employing the photosensitive cell of this invention may be used to evaluate the light characteristics of the identical scene within the field of view of the camera lens system. At the same time, the image recorded at the film plane remains substantially uneffected by the photosensitive cell due to the high light transmissivity characteristics of the transducer.

BRIEF DESCRIPTION OF THE DRAWINGS

The novel features that are considered characteristic of the invention are set forth with particularity in the appended claims. The invention itself, however, both as to its organization and its method of operation, together with other objects and advantages thereof, will be best understood from the following description of the illustrated embodiment or when read in connection with the accompanying drawings or in like members have been employed in the different figures to note the same parts and wherein:

FIG. 1 is a cross-sectional view depicting the photosensitive cell of this invention.

FIG. 2 is a side elevation view, partly in cross-section, showing a sputtering apparatus for depositing some of the thin films which make up the photosensitive cell of FIG. 1.

FIG. 3A is a side elevation view diagrammatically depicting the first step in the process of applying a photoconductive layer to the photosensitive cell of FIG. 1.

FIG. 3B is a side elevation view diagrammatically representing a second step in applying the photoconductive layer to the photosensitive cell of FIG. 1.

FIG. 3C is a side elevation view diagrammatically illustrating a third step in the process of applying a photoconductive layer to the photosensitive cell of FIG. 1.

FIG. 4 is a cross-sectional view of a camera apparatus embodying the photosensitive cell of FIG. 1.

FIG. 4A is a broken-away view, in cross section, showing an alternate embodiment of FIG. 4.

FIG. 5 is a schematic representation for chemical compounds suitable for use as the photoconductive layer in the photosensitive cell of FIG. 1.

FIG. 9 is a front plan view for an alternate arrangement for the photosensitive cell of FIG. 1.

DESCRIPTION OF THE PREFERRED EMBODIMENTS

Figure 6:
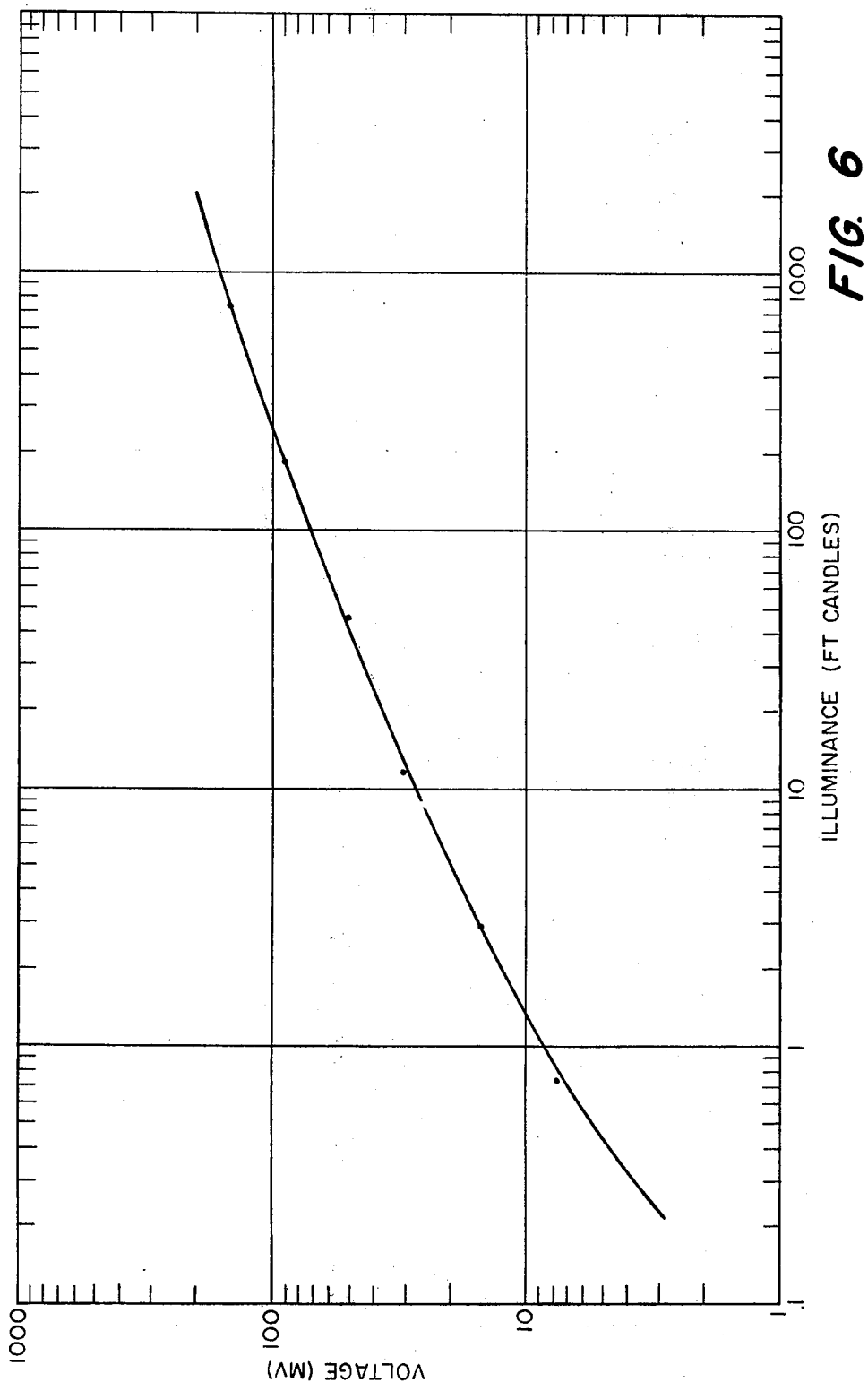
FIG. 6 is a graphical representation of the photovoltaic response in millivolts vs. illuminance in foot candles for the photosensitive cell of this invention.

Referring to FIG. 1, there is shown at 10 a photosensitive polarized transducer or cell having a substantially transparent substrate 12 which may be either glass or plastic such as a polymerized derivative of methacrylic acid now known to the trade as "Lucite." An electroconductive substantially transparent layer 14 of preferably tin oxide-indium oxide is deposed on the substrate 12 in order to provide a first electrode. Overlying the electroconductive layer 14, there is provided a substantially transparent photoconductive layer 16 comprised of a polymerized vinyl-carbazole compound applied in a manner to be subsequently described in detail. A second substantially transparent electroconductive layer 18 also consisting of tin oxide-indium oxide is thereafter sputtered onto the photoconductive layer 16 so as to provide a second electrode. The electroconductive layers of tin oxide-indium oxide can be applied in a manner also to be subsequently described in detail. Electroconductive leads 24 and 26 are connected to the respective electroconductive layers 18 and 14 by means of a silver paste deposed respectively at 28 and 30 so as to provide respective ohmic contacts between the leads 24, 26 and electroconductive layers 18 and 14. Other types of commercially available conductive pastes may also be used in place of the aforementioned silver paste so long as the contacts are ohmic in nature whereas nonohmic contacts would likely require substantially higher voltages in order, for instance, to breakdown any interelectrode capacitance.

The photosensitive cell 10 herein described may be connected to function as either a photoconductive cell or a photovoltaic cell. The terms photoconductive as used herein is intended to indicate a resistive impedance whose electrical resistance changes as an approximately inverse power function of the intensity of radiation over a predetermined radiation-frequency range, for example, visible light, ultra-violet and infrared radiation, or when subjected to a variety of radiation as for instance $\alpha$, $\beta$, $\gamma$ and X-radiation. By placing such a photoconductor in series with an electrically resistive element of substantially constant value, one can obtain a combination, the conductance of which varies substantially linearly with the logarithm of the intensity of incident radiation. When such a photoconductor is placed in parallel with an electrically resistive element, one obtains a combination, the resistance of which varies substantially linearly with the logarithm of the intensity of incident radiation.

The term photovoltaic, as used herein, is intended to indicate the generation of an electromotive force across the electroconductive layers 14 and 18 when subject to irradiation over a predetermined radiation frequency range, for example, visible light, ultra-violet and infrared radiation or when subjected to a variety of radiation as for instance $\alpha$, $\beta$, $\gamma$ and X-radiation. While the photosensitive transducer 10 described herein has particular utility in detecting visible light intensity, the following principles of this invention may apply also to other types of radiation in the invisible spectrum as for example, X-rays, infrared radiations, ultra-violet light, and the like. Therefore, for simplicity, the terms radiant energy or radiation will be understood to encompass X-rays as well as visible and invisible light, and the terms photosensitive, photoconductive and photovoltaic will be employed as generic expressions for the property of responding to radiant energy or radiation.

The term polarized referes to the consistent polarity of the photovoltaic voltage generated across the electroconductive layers 14 and 18 regardless of the orientation of the transducer with respect to the direction of incident radiation as will be subsequently described in more detail.

Electroconductive layer 14 preferably comprises tin oxide-indium oxide deposed in a thin layer of substantially uniform thickness on substrate 12. The electroconductive layer 14 has a maximum uniform radiation transmissiveness therethrough and may be said to be substantially transparent with respect to visible light having wave lengths of between 4,000 angstroms and 8,000 angstroms. The tin oxide-indium oxide layer is preferably applied by sputtering in a manner to be subsequently described in substantial detail although other known means for application, such as vacuum deposition, can also be used for the particular electroconductive layer. Electroconductive layer 14 is preferably applied to a sufficient thickness to have a continuous electrical conductivity throughout while still remaining substantially transparent. A typical thickness for the electroconductive layer 14 may be in the order of 5,000 angstroms. Although tin oxide-indium oxide is the preferred composition for the electroconductive layer 14, it will be readily understood that other conductive and transmissive materials such as gold or tin oxide may be applied at a minimal thickness so as to provide the requisite electroconductivity throughout without substantially impairing transparency to visible light. The electroconductive layer 14 provides a dual function by first operating as an electrode to which the electroconductive lead 26 may be connected through ohmic contact 30 and by secondly providing an adhesive layer to which the photoconductive layer 16 may attach.

Polymerized vinyl carbazole compounds suitable for use in the present invention are poly-N-vinylcarbazole and polyvinyl-N-lower alkylcarbazoles. Such compounds have the structural formula as shown in FIG. 5 wherein X is selected from the group consisting of vinyl and lower alkyl: and wherein Y is vinyl only when X is lower alkyl. The numbering of FIG. 5 is based on the International Union of Pure and Applied Chemistry — Definitive Rules for Nomenclature of Organic Compounds JACS 82, 5545–5574, 5568[1960]. Examples of polyvinyl-N-lower alkylcarbazole are poly-2-vinyl-N-methylcarbazole, poly-3-vinyl-N-ethylcarbazole, poly-2-vinyl-N-ethylcarbazole, poly-3-vinyl-N-methylcarbazole, poly-3-vinyl-N-isopropylcarbazole, poly-2-vinyl-N-butylcarbazole, poly-3-vinyl-N-butylcarbazole, poly-2-vinyl-N-pentylcarbazole, poly-3-vinyl-N-pentylcarbazole, poly-2-vinyl-N-hexylcarbazole, poly-3-vinyl-N-hexylcarbazole, poly-2-vinyl-N-heptylcarbazole, and poly-3-vinyl-N-heptylcarbazole. Mixtures in copolymers of the polymerized vinyl-carbazole compounds also may be used.

Poly-N-vinylcarbazole, which is the preferred polymer is an addition polymerization product of N-vinylcarbazole and is commercially available from Badische Anilinund Sodafabrick A.G., Ludwigshafen Rhein, under the registered trademark "Luvican." A method of producing poly-N-vinyl-carbazole is described in U.S. Pat. No. 2,072,465. Its use as a photoconductor is described in U.S. Pat. No. 3,037,861 which states that when an electrostatically charged layer of poly-N-vinylcarbazole is exposed to ultra-violet light, it becomes conductive and the charge in the light-struck area is dissipated.

For the purpose of illustrating the method of applying the photoconductive layer 16 to the electroconductive layer 14, the following description in reference to FIGS. 3A through 3C is based on compositions of the present invention in which the polymerized vinylcarbazole compound is the preferred poly-N-vinylcarbazole. It will be understood that the results obtained based on these compositions containing poly-N-vinylcarbazole will be essentially the same as the results obtained based on compositions containing the vinyl-N-lower alkyl carbazole polymers.

The photoconductive material of the present invention is prepared by dissolving a polymerized vinyl-carbazole compound together with 2,4,7 trinitro-9-fluorenone in tetrahydrofuran which operates as a solvent. The polymer solution is then mixed for about 30 minutes. By way of example, a specific formulation of the preferred composition is as follows: 250 mg. of polyvinylcarbazole dissolved in solution with 20 ml. of tetrahydrofuran to which is added 5 mg of 2,4,7 -trinitro-9-fluorenone.

The polymer solution is then coated on the electroconductive layer 14 by depositing a drop, as shown in FIG. 3A, through the aid of an ordinary eye dropper 32. The substrate 12 may be of a conventional glass microscope slide having dimensions in the order of 2 inches by 2 inches. After a drop of the polyvinylcarbazole has been deposited, an uncoated glass slide 32' may be placed on top of the solution in order to spread the solution evenly between the slide 32' and conductive layer 14. The uncoated slide 32' may thereafter be slipped off in a direction substantially parallel to the plane of the substrate 12 as shown in FIG. 3C. In this manner, the polyvinylcarbazole solution may be deposited in a thin layer of substantially uniform thickness on the electroconductive layer 14.

While tetrahydrofuran is the preferred solvent, other solvents such as 1,2-dichloroethene and chlorobenzene may also be used. In addition, while the above-described method for applying the polyvinylcarbazole solution is preferred, it will be readily appreciated that other methods known in the art for applying a solution in a thin layer of substantially uniform thickness to a planar surface may also be used. Such methods may include the techniques of spraying or centrifuging the solution onto the surface to be coated.

For further information regarding polyvinylcarbazole solution, reference may be made to U.S. Pat. No. 3,484,237 to M.D. Shattuck et al.

After the photoconductive layer 16 of poly-N-vinyl-carbazole has been allowed sufficient time to dry and adhere to the electroconductive layer 14, there is applied the second electroconductive layer 18 of tin oxide-indium oxide in the following manner. Referring now to FIG. 2, there is shown generally at 35 apparatus suitable for RF sputtering a thin film of tin oxide-indium oxide over the poly-N-vinylcarbazole layer 16. The tin oxide-indium oxide film includes a plurality of coatings, each of which is separately sputtered onto the top of the previous coating in the following manner. The sputtering apparatus 35 includes a bell jar 36 carried on a suitable base plate 37. The bell jar 36 may be evacuated to a pressure below atmospheric by means of a suitable vacuum pump 38, after which, an inert gas, such as argon, is mixed with about 5% oxygen and then admitted through a valve 40. The substrate 12 is releasably clamped to a target support 46 so as to be maintained in space-apart relation relative to a tin oxide-indium oxide source 44 which releasably clamps to a source support 48. The substrate 12 and its associated electroconductive and photoconductive layers are suitably masked so that the sputtered tin oxide-indium oxide layer will not overlap the poly-N-vinylcarbazole layer 16 to contact conductive layer 14 and thus short out the photoelectric cell 10. A source 42 of high alternating potential is connected between the tin oxide-indium oxide source 44 and substrate 12 wherein the tin oxide-indium oxide is RF sputtered onto the poly-N-vinyl-carbazole layer 16 by an alternating voltage of approximately 13.6 megacycles having a peak-to-peak voltage of about 1500 volts and drawing about 72 milliamps.

The tin oxide-indium oxide source 44 is supported above the substrate 12 at a distance of about 4 inches which distance is determined in part by the thickness desired for the applied coating. It will be readily appreciated that the inverse square law applied such that a surface placed at twice the distance from the source will receive one-fourth of the amount of the deposit per unit area.

The tin oxide-indium oxide is preferably sputtered in a series of individual coatings to a sufficient thickness to have a continuous electrical conductivity throughout while still remaining substantially transparent to actinic radiation within the range of visible light. A typical thickness for the electroconductive layer 18 may be in the order of 5,000 angstroms with each coating being as thin as 50 angstroms. In the preferred mode, the first conductive layer 14 would also comprise a thin film of tin oxide-indium oxide deposited in the above-described manner and both layers of tin oxide-indium oxide would preferably comprise 90% tin oxide and 10% indium oxide. The addition of indium oxide to tin oxide has been found to be necessary in order to eliminate a slight yellowish cast which would otherwise appear were tin oxide to be used by itself. It should be readily appreciated that the thicknesses of the deposited layers as illustrated in the drawings have been grossly exaggerated for the purposes of illustration.

The mechanism of the above-described photosensitive cell 10 which provides a polarized photovoltaic effect is that a pn junction is formed between the outside tin oxide-indium oxide layer 18 and the photoconductive layer of poly-N-vinylcarbazole wherein the tin oxide-indium oxide layer is the n side of the junction with the poly-N-vinyl-carbazole layer being the p side of the pn junction. Thus, the boundary between the photoconductive layer 16 and the second electrically conductive layer 18 defines a barrier layer wherein the second electrically conductive layer 18 includes a plurality of donor ions adjacent the barrier layer while the photoconductive layer 16 includes a plurality of acceptor ions adjacent the barrier layer such that the cell exhibits a polarized photovoltaic effect when irradiated. Thus, the tin oxide-indium oxide layer 18 is always the negative electrode of the photovoltaic voltage while the tin oxide-indium oxide layer 14 is always the positive electrode of the photovoltaic voltage regardless of the orientation of the cell with respect to incident radiation.

Since the various layers of the photosensitive cell 10 are substantially transparent, the cell becomes equally responsive to light received for either side of the area while still maintaining the same voltage polarity at electrodes 14 and 18. The fact that the photosensitive cell 10 of this invention is substantially equally responsive to light received from either side of it, makes it suitable for use in solar cell systems as previously discussed. Solar cells are used in satellites and other similar objects and cannot always be oriented to the most favorable position relative to the sun. Therefore, it is ordinarily necessary to provide for those areas in different planes to insure an electrical output regardless of the orientation of any one solar cell relative to the position of the sun. However, by utilizing a photoelectric cell in accordance with the present invention, each cell area will operate in response to solar radiation received from either of two opposite directions while still maintaining the same output voltage polarity thereby reducing by one-half the number of such cells required.

Referring now to FIG. 6, there is shown a graph illustrating the photovoltaic effect of the photosensitive cell 10 of this invention. The abscissa of the graph is calibrated to show illuminance in foot candles ranging from one foot candle up to a thousand foot candles. The ordinate of the graph is calibrated to show the photovoltaic potential generated by the cell in the range from 1 millivolt up to 1,000 millivolts. It will be appreciated that the photosensitive cell exhibits a highly desirable linear range of photovoltaic sensitivities as for instance the cell will exhibit approximately 2 millivolts at 0.1 foot candles illuminance and conversely will exhibit approximately 150 millivolts at 1,000 foot candles illuminance.

Figure 7:
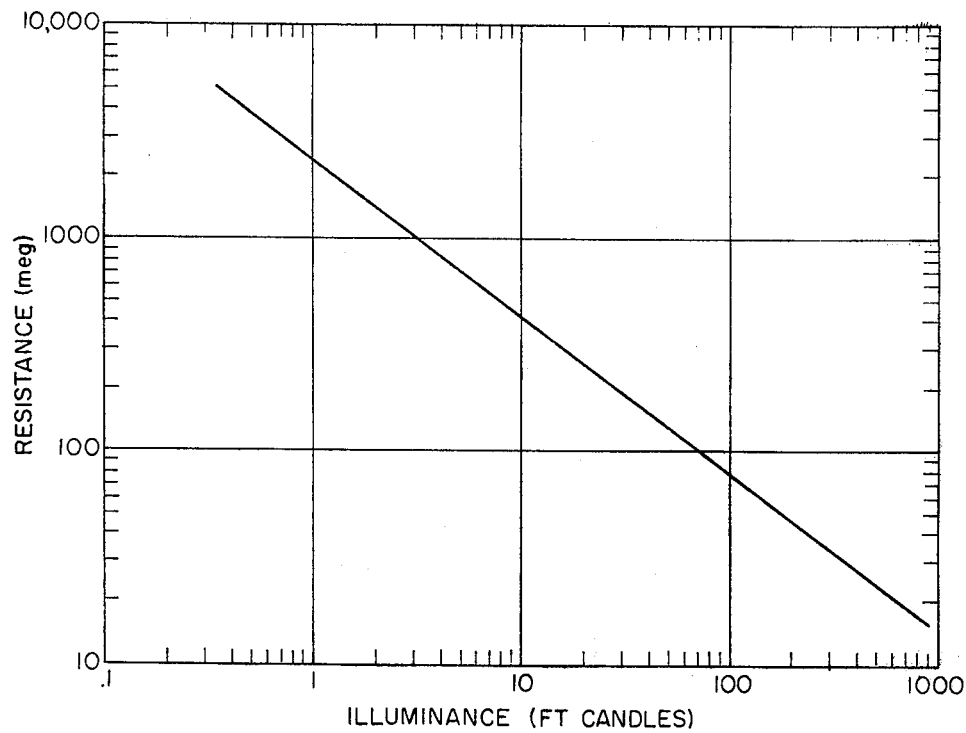
FIG. 7 is a graphical representation of the photoconductive response showing resistance in megohms vs. illuminance in foot candles for the photosensitive cell of this invention.

Referring now to FIG. 7, there is shown a graph illustrating the photoconductive response exhibited by the photosensitive cell 10 of this invention. The abscissa is again calibrated to show illuminance in foot candles ranging from 0.1 foot candle to 1,000 foot candles with the ordinate calibrated to show resistance in megohms ranging from 10 megohms to 10,000 megohms. It can thus be seen that the electrical resistance varies over a highly desirable linear range of photoconductive sensitivities in approximately inverse relation with the log of the intensity of illuminance to which it is exposed. The above-described graphs of FIGS. 6 and 7 are representative of a circular photoelectric cell made in accordance with the above-described teaching of this invention wherein the cell has a diameter of approximately one inch.

Figure 8:
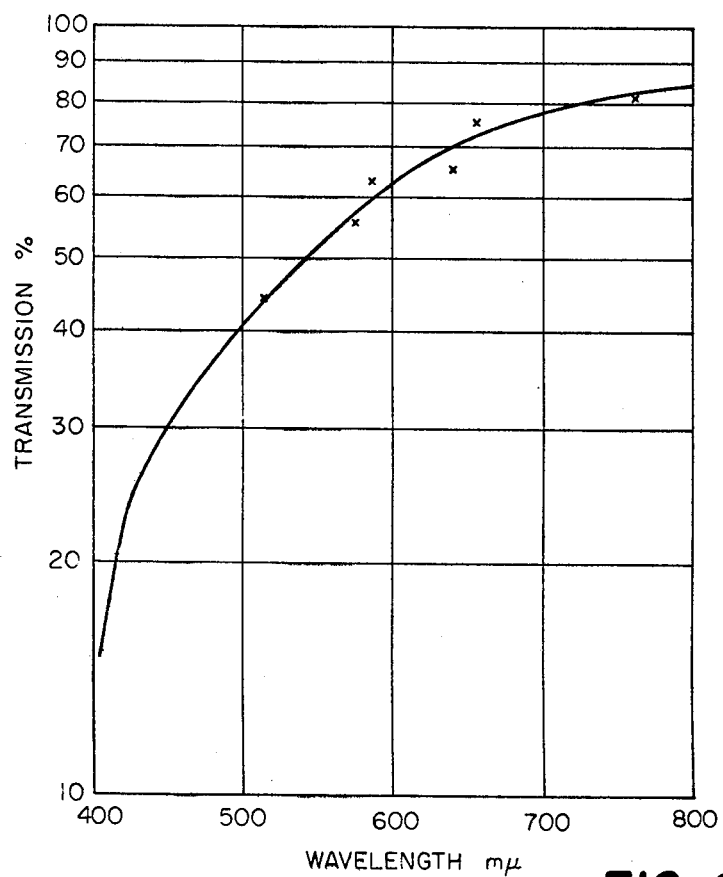
FIG. 8 is a graphical representation of the transmissivity of the photoelectric cell of FIG. 1 as plotted against the wave length of visible light in the range of between 400 and 800 millimicrons.

Referring now to FIG. 8, there is shown a graph representing the transmissivity of radiation through the photosensitive cell of this invention within the range of visible light having wave lengths between 400 and 800 millimicrons. The ordinate represents the percentage of transmission of visible light through the photosensitive cell which is nearly 100% for wave lengths near the infrared range of 800 millimicrons. The transmissivity of the photosensitive cell falls off toward the shorter wave lengths and the ultraviolet range of less than 400 millimicrons. Thus, it is readily apparent that the photosensitive cell of this invention could also be used as a filter or attenuator in a manner to be made more apparent from the following discussion.

Automatic exposure control systems employing photosensitive cells of the type herein described have been used in photographic apparatus in order to improve and simplify the procedures for effectively operating such photographic devices. The systems basically function to evaluate scene brightness or illumination, weight this evaluation with respect to the sensitometric characteristics of the film being exposed and regulate one or more variable exposure control parameters such as exposure interval or aperture size in correspondence with the weight of the evaluation. Scene brightness evaluation is performed with light measuring circuits utilizing one or more of the photosensitive cells as herein described positioned upon a photographic apparatus. The photosensitive cell is aligned in a manner to be responsive to the light characteristics of a scene approximately coincident with that of the field of view of a camera system.

Referring now to FIG. 4, there is shown a camera apparatus 50 having a housing 51 through which there is provided a light entering exposure opening 52 which defines the maximum available exposure aperture for the photographic apparatus. An objective or taking lens 54 is provided in overlying relation with respect to the light entering opening 52 wherein the objective lens may comprise a plurality of elements retained in predetermined space relationships. The elements of the objective lens 54 may be displaced by focusing means (not shown) in order to focus the image carrying rays through the light entering exposure opening 52 to a rearwardly positioned film plane 56. The camera apparatus 50 also includes a viewfinder 58 which may have a reflex capability so that an operator can determine the scene to be photographed by viewing directly through the objective lens. In order that the photosensitive cell of this invention be directly responsive to the light characteristics of the scene within the objective lens field of view, the photosensitive cell 10 is stationed within the camera housing 51 to intercept the image carrying rays prior to impingement upon the film plane 56. In this manner, the light characteristics evaluated by the photosensitive cell 10 are exactly the same as those falling within the field of view of the objective lens 54. At the same time, the image recorded at the film plane 56 remains substantially uneffected due to the high light transmissivity characteristics of the photosensitive cell 10. A great deal of latitude is provided as to where the photosensitive cell 10 may be stationed in relation to the objective lens 54, as for example, the photosensitive cell may be stationed behind the objective lens 54 as shown in FIG. 4 or it may be stationed in front of the objective lens as shown in FIG. 4A. Also, as readily apparent, it is not necessary that all the image carrying rays from the objective lens pass through the photosensitive cell 10 in that only a portion of the image carrying rays need be intercepted by the photosensitive cell 10 for a satisfactory evaluation of the scene brightness.

Referring now to FIG. 9, there is shown an alternate arrangement for the above-described photocell wherein there is included a reticular insulator 60 for dividing the photocell 10 into a plurality of discrete sections 62. Each section may be connected to a pair of conductive leads (not shown) and individually sensed to provide a plurality of various signals representative of the variations in light characteristics over the field of view. Photocells of this type may also be stationed either behind or in front of the objective lens of a camera apparatus in the above-described manner.

Due to the attenuating or filtering characteristics which may be exhibited by each photosensitive cell 10 of this invention as hereinabove described, it is possible that the photosensitive cell of FIG. 4 may provide the dual function of evaluating the characteristics scene light as well as filtering undesired radiation wave lengths from the image carrying rays. In this manner, a photographic emulsion tailored to compensate for the deficiency of indoor light at the shorter wave lengths may also be used for outdoor photography where the shorter wave lengths would be filtered by the attenuating affect of the photoelectric cell.

A photosensitive cell of this invention may be practiced or embodied in still other ways without parting from the spirit or essential character thereof. Embodiments described herein are therefore illustrative and not restrictive, the scope of the invention being indicated by the appended claims in all variations which come within the meaning of the claims are intended to be embraced therein.

What is claimed is:

1. A polarized photosensitive transducer of the type exhibiting both a photovoltaic and a photoconductive effect comprising:

a transparent substrate;

a first electrically conductive layer disposed on said substrate to a sufficient thickness to display a continuous electrical conductivity throughout while still accommodating the transmission of visible light;

a photoconductive layer comprising a mixture of poly-N-vinylcarbazole and 2,4,7 -trinitro-9-fluorenone deposed on said electrically conductive layer; and a second electrically conductive layer comprising tin oxide-indium oxide sputtered on said photoconductive layer to a sufficient thickness to display a continuous electrical conductivity throughout while accommodating the transmission of visible light to provide a barrier layer at the boundary between said photoconductive layer and said second layer resulting in said transducer displaying a polarized photovoltaic response regardless of transducer orientation with respect to incident radiation.

2. The Photosensitive transducer of claim 1 wherein: said first electrically conductive layer comprises a film of tin 3. The photosensitive transducer of claim 1 wherein said mixture of poly-N-vinylcarbazole, and 2,4,7, -trinitro-9-fluorenone are mixed in ratios corresponding to approximately 250 mg. of poly-N-vinylcarbazole, and 5 mg. of 2,4,7 -trinitro-9-fluorenone.

4. The photosensitive transducer of claim 1 wherein said tin oxide-indium oxide layer respectively comprises approximately 90% tin oxide and 10% indium oxide.

* * * * *